United States Patent
Bayman et al.

(10) Patent No.: US 7,217,658 B1
(45) Date of Patent: May 15, 2007

(54) PROCESS MODULATION TO PREVENT STRUCTURE EROSION DURING GAP FILL

(75) Inventors: Atiye Bayman, Palo Alto, CA (US); George D. Papasouliotis, Sunnyvale, CA (US); Yong Ling, Fremont, CA (US); Weijie Zhang, San Jose, CA (US); Vishal Gauri, Sunnyvale, CA (US); Mayasari Lim, London (GB)

(73) Assignee: Novellus Systems, Inc., San Jose, CA (US)

( * ) Notice: Subject to any disclaimer, the term of this patent is extended or adjusted under 35 U.S.C. 154(b) by 287 days.

(21) Appl. No.: 10/935,909

(22) Filed: Sep. 7, 2004

(51) Int. Cl.
*H01L 21/44* (2006.01)

(52) U.S. Cl. .................. 438/680; 438/513; 438/700; 257/E21; 257/17; 257/218; 257/278

(58) Field of Classification Search ............... 438/680, 438/681, 692, 695, 270, 700, 474, 475, 513, 438/424, 743, 744, 756, 757, 738, 688
See application file for complete search history.

(56) References Cited

U.S. PATENT DOCUMENTS

| | | |
|---|---|---|
| 4,361,461 A | 11/1982 | Chang |
| 5,129,958 A | 7/1992 | Nagashima et al. |
| 5,227,191 A | 7/1993 | Nagashima |
| 5,246,885 A | 9/1993 | Braren et al. |
| 5,252,178 A | 10/1993 | Moslehi |
| 5,270,264 A | 12/1993 | Andideh et al. |
| 5,282,925 A | 2/1994 | Jeng et al. |
| 5,342,801 A | 8/1994 | Perry et al. |
| 5,385,857 A | 1/1995 | Solo de Zaldlvar |
| 5,494,854 A | 2/1996 | Jain |
| 5,516,729 A | 5/1996 | Dawson et al. |
| 5,532,516 A | 7/1996 | Pasch et al. |
| 5,621,241 A | 4/1997 | Jain |
| 5,622,894 A | 4/1997 | Jang et al. |

(Continued)

FOREIGN PATENT DOCUMENTS

JP 2003-031649 1/2003

OTHER PUBLICATIONS

Papasouliotis et al., "Dynamic Modification of Gap-Fill Process Characteristics", U.S. Appl. No. 10/947,424, filed Sep. 21, 2004.

(Continued)

*Primary Examiner*—David Nhu
(74) *Attorney, Agent, or Firm*—Beyer Weaver LLP

(57) ABSTRACT

High density plasma chemical vapor deposition and etch back processes fill high aspect ratio gaps without liner erosion or further underlying structure attack. The characteristics of the deposition process are modulated such that the deposition component of the process initially dominates the sputter component of the process. For example, reactive gasses are introduced in a gradient fashion into the HDP reactor and introduction of bias power onto the substrate is delayed and gradually increased or reactor pressure is decreased. In the case of a multi-step etch enhanced gap fill process, the invention may involve gradually modulating deposition and etch components during transitions between process steps. By carefully controlling the transitions between process steps, including the introduction of reactive species into the HDP reactor and the application of source and bias power onto the substrate, structure erosion is prevented.

41 Claims, 6 Drawing Sheets

U.S. PATENT DOCUMENTS

| | | | |
|---|---|---|---|
| 5,636,320 A | 6/1997 | Yu et al. | |
| 5,641,545 A | 6/1997 | Sandhu | |
| 5,702,982 A | 12/1997 | Lee et al. | |
| 5,705,419 A | 1/1998 | Perry et al. | |
| 5,711,998 A | 1/1998 | Shufflebotham | |
| 5,789,818 A | 8/1998 | Havermann | |
| 5,834,068 A | 11/1998 | Chern et al. | |
| 5,851,344 A | 12/1998 | Xu et al. | |
| 5,858,876 A | 1/1999 | Chew | |
| 5,869,902 A | 2/1999 | Lee et al. | |
| 5,872,058 A | 2/1999 | Van Cleemput et al. | |
| 5,897,370 A | 4/1999 | Joshi et al. | |
| 5,910,020 A | 6/1999 | Yamada | |
| 5,911,133 A | 6/1999 | Yao et al. | |
| 5,913,140 A | 6/1999 | Roche et al. | |
| 5,920,792 A | 7/1999 | Lin | |
| 5,937,323 A | 8/1999 | Qrezyk et al. | |
| 5,953,635 A | 9/1999 | Andideh | |
| 5,962,923 A | 10/1999 | Xu et al. | |
| 5,963,840 A | 10/1999 | Xia et al. | |
| 5,968,610 A * | 10/1999 | Liu et al. | 427/579 |
| 5,972,192 A | 10/1999 | Dubin et al. | |
| 6,027,663 A | 2/2000 | Martin et al. | |
| 6,030,881 A * | 2/2000 | Papasouliotis et al. | 438/424 |
| 6,037,018 A * | 3/2000 | Jang et al. | 427/579 |
| 6,077,451 A | 6/2000 | Takenaka et al. | |
| 6,077,574 A | 6/2000 | Usami | |
| 6,100,205 A * | 8/2000 | Liu et al. | 438/788 |
| 6,106,678 A | 8/2000 | Shufflebotham et al. | |
| 6,124,211 A | 9/2000 | Butterbaugh et al. | |
| 6,136,703 A | 10/2000 | Vaartstra | |
| 6,149,779 A | 11/2000 | Van Cleemput | |
| 6,184,158 B1 * | 2/2001 | Shufflebotham et al. | 438/788 |
| 6,200,412 B1 | 3/2001 | Kilgore et al. | |
| 6,211,065 B1 | 4/2001 | Xi et al. | |
| 6,232,196 B1 | 5/2001 | Raaijmakers et al. | |
| 6,265,269 B1 | 7/2001 | Chen et al. | |
| 6,277,764 B1 | 8/2001 | Shin et al. | |
| 6,331,494 B1 | 12/2001 | Olson et al. | |
| 6,335,261 B1 | 1/2002 | Natzle et al. | |
| 6,395,150 B1 | 5/2002 | Van Cleemput et al. | |
| 6,400,023 B2 | 6/2002 | Huang | |
| 6,410,446 B1 * | 6/2002 | Tsai et al. | 438/695 |
| 6,451,705 B1 | 9/2002 | Trapp et al. | |
| 6,479,361 B1 | 11/2002 | Park | |
| 6,479,396 B1 | 11/2002 | Xu et al. | |
| 6,486,081 B1 | 11/2002 | Ishikawa et al. | |
| 6,500,728 B1 | 12/2002 | Wang | |
| 6,531,377 B2 | 3/2003 | Knorr et al. | |
| 6,566,229 B2 | 5/2003 | Hong et al. | |
| 6,569,777 B1 | 5/2003 | Hsu et al. | |
| 6,596,653 B2 | 7/2003 | Tan et al. | |
| 6,596,654 B1 | 7/2003 | Bayman et al. | |
| 6,599,829 B2 | 7/2003 | Smith et al. | |
| 6,617,207 B1 | 9/2003 | Kiryu et al. | |
| 6,642,105 B2 | 11/2003 | Kim et al. | |
| 6,706,541 B1 | 3/2004 | Toprac et al. | |
| 6,737,334 B2 | 5/2004 | Ho et al. | |
| 6,787,483 B1 | 9/2004 | Bayman et al. | |
| 6,794,290 B1 | 9/2004 | Papasouliotis et al. | |
| 6,808,748 B2 | 10/2004 | Kapoor et al. | |
| 6,812,043 B2 | 11/2004 | Bao et al. | |
| 6,821,905 B2 | 11/2004 | Pan et al. | |
| 6,846,391 B1 | 1/2005 | Papasouliotis et al. | |
| 6,846,745 B1 | 1/2005 | Papasouliotis et al. | |
| 6,852,639 B2 * | 2/2005 | Rudolph et al. | 438/714 |
| 6,867,086 B1 | 3/2005 | Chen et al. | |
| 6,958,112 B2 | 10/2005 | Karim et al. | |
| 7,001,854 B1 | 2/2006 | Papasouliotis et al. | |
| 7,067,440 B1 | 6/2006 | Bayman et al. | |
| 7,078,312 B1 | 7/2006 | Sutanto et al. | |
| 7,122,485 B1 | 10/2006 | Papasouliotis et al. | |
| 2001/0019903 A1 | 9/2001 | Shufflebotham et al. | |
| 2001/0044203 A1 | 11/2001 | Huang et al. | |
| 2002/0052119 A1 | 5/2002 | Van Cleemput | |
| 2002/0084257 A1 | 7/2002 | Bjorkman et al. | |
| 2002/0179570 A1 | 12/2002 | Mathad et al. | |
| 2003/0003244 A1 | 1/2003 | Rossman | |
| 2003/0003682 A1 | 1/2003 | Moll et al. | |
| 2003/0087506 A1 | 5/2003 | Kirchhoff | |
| 2003/0165632 A1 | 9/2003 | Lin et al. | |
| 2003/0203652 A1 | 10/2003 | Bao et al. | |
| 2003/0207580 A1 | 11/2003 | Li et al. | |
| 2004/0020894 A1 | 2/2004 | Williams et al. | |
| 2004/0058549 A1 | 3/2004 | Ho et al. | |
| 2004/0082181 A1 | 4/2004 | Doan et al. | |
| 2004/0110390 A1 | 6/2004 | Takagi et al. | |
| 2004/0241342 A1 | 12/2004 | Karim et al. | |
| 2005/0074946 A1 | 4/2005 | Chu et al. | |
| 2005/0130411 A1 | 6/2005 | Bao et al. | |
| 2005/0136576 A1 | 6/2005 | Ishihara et al. | |
| 2005/0136686 A1 | 6/2005 | Kim et al. | |
| 2005/0250346 A1 | 11/2005 | Schmitt | |

OTHER PUBLICATIONS

U.S. Office Action mailed Aug. 6, 2003, from U.S. Appl. No. 10/058,897.

U.S. Office Action mailed Jan. 29, 2004, from U.S. Appl. No. 10/058,897.

U.S. Office Action mailed May 21, 2004, from U.S. Appl. No. 10/058,897.

U.S. Office Action mailed Aug. 10, 2004, from U.S. Appl. No. 10/271,333.

U.S. Office Action mailed Apr. 14, 2004, from U.S. Appl. No. 10/271,333.

U.S. Office Action mailed Jun. 29, 2005, from U.S. Appl. No. 10/728,569.

Papasouliotis et al., "Hydrogen-Based Phosphosilicate Glass Process for Gap Fill of High Aspect Ratio Structures", Novellus Systems, Inc., filed Oct. 11, 2002, U.S. Appl. No. 10/271,333, pp. 1-28.

Guari et al., "Method of Preventing Structures Erosion During Multi-Step Gap Fill", Novellus Systems, Inc., filed Dec. 4, 2003, U.S. Appl. No. 10/728,569, pp. 1-29.

U.S. Office Action mailed Jan. 7, 2005, from U.S. Appl. No. 10/728,569.

U.S. Office Action mailed Nov. 6, 2002, from U.S. Appl. No. 09/996,619.

U.S. Office Action mailed Mar. 2, 2004, from U.S. Appl. No. 10/442,846.

Bayman et al., "Gap Fill For High Aspect Ratio Structures", Novellus Systems, Inc., filed Jul. 13, 2004, U.S. Appl. No. 10/890,655, pp. 1-24.

U.S. Office Action mailed Jul. 25, 2005, from U.S. Appl. No. 10/890,655.

U.S. Office Action mailed Apr. 30, 2004, from U.S. Appl. No. 10/389,164.

Sutanto et al., "Method For Controlling Etch Process Repeatability", Novellus Systems, Inc., filed Sep. 2, 2003, U.S. Appl. No. 10/654,113, pp. 1-31.

U.S. Office Action mailed Jun. 17, 2004, from U.S. Appl. No. 10/654,113.

U.S. Office Action mailed Dec. 2, 2004, from U.S. Appl. No. 10/654,113.

U.S. Office Action mailed Mar. 31, 2005, from U.S. Appl. No. 10/654,113.

Papasouliotis et al., "Dynamic Modification of Gap-Fill Process Characteristics", Novellus Systems, Inc., filed Sep. 21, 2004, U.S. Appl. No. 10/947,424, pp. 1-25.

Hook et al., "The Effects of Fluorine on Parametrics and Reliability in a 0.18-μm 3.5/6.8 nm Dual Gate Oxide CMOS Technology", IEEE Transactions on Electron Devices, vol. 48, No. 7., Jul. 2001, pp. 1346-1353.

Shanker et al., "Hydrogen Treatment Enhanced Gap Fill", Novellus Systems, Inc., filed Mar. 16, 2005, U.S. Appl. No. 11/082,369, pp. 1-33.

Papasoulitotis et al., "Deposition Profile Modification Through Process Chemistry", Novellus Systems, Inc., filed Dec. 9, 2002, U.S. Appl. No. 10/316,987, pp. 1-35.

U.S. Office Action mailed Jan. 27, 2005, from U.S. Appl. No. 10/316,987.

U.S. Office Action mailed Jul. 14, 2005, from U.S. Appl. No. 10/316,987.

Zhu et al., "Biased $H_2$ Etch Process In Deposition-Etch-Deposition Gap Fill", Novellus Systems, Inc., filed Dec. 10, 2003, U.S. Appl. No. 10/733,858, pp. 1-28.

U.S. Office Action mailed Apr. 19, 2005, from U.S. Appl. No. 10/733,85.

U.S. Office Action mailed Oct. 7, 2005, from U.S. Appl. No. 10/733,85.

Lang et al., "Helium-Based Etch Process in Deposition-Etch-Deposition Gap Fill", Novellus Systems, Inc., filed Jun. 22, 2005, U.S. Appl. No. 11/159,834, pp. 1-29.

U.S. Office Action mailed Nov. 17, 2005, from U.S. Appl. No. 10/316,987.

Lang et al., "Stain Engineering—HDP Thin Film With Tensile Stress For FEOL and Other Applications", Novellus Systems, Inc., filed Nov. 17, 2004, U.S. Appl. No. 10/991,890, pp. 1-35.

U.S. Office Action mailed Oct. 18, 2005, from U.S. Appl. No. 10/947,424.

Lang et al., "Using Water (H20) To Replace Oxygen (02) In A Silicon Dioxide (Si02) Thin Film Deposition Process for HDP STI Technology", Novellus Systems, Inc., filed Nov. 9, 2005, U.S. Appl. No. 11/272,487, pp. 1-25.

U.S. Office Action mailed Dec. 14, 2005, from U.S. Appl. No. 10/728,569.

Nguyen et al., "Halogen-Free Noble Gas Assisted $H_2$ Plasma Etch Process in Deposition-Etch-Deposition Gap Fill", Novellus Systems, Inc., filed Mar. 1, 2006, U.S. Appl. No. 11/366,220.

U.S. Office Action mailed Feb. 16, 2006, from U.S. Appl. No. 11/082,369.

U.S. Office Action mailed Mar. 24, 2006, from U.S. Appl. No. 10/733,858.

U.S. Office Action mailed Jun. 1, 2006, from U.S. Appl. No. 10/728,569.

U.S. Office Action mailed Apr. 19, 2006, from U.S. Appl. No. 10/947,424.

U.S. Office Action mailed Sep. 29, 2006, from U.S. Appl. No. 11/082,369.

Yu et al., "Stress Profile Modulation in STI Gap Fill," Novellus Systems, Inc., U.S. Appl. No. 11/471,958, filed Jun. 20, 2006, pp. 1-27.

* cited by examiner

PROCESS MODULATION TO PREVENT STRUCTURE EROSION DURING GAP FILL

BACKGROUND OF THE INVENTION

The present invention relates to methods of manufacturing semiconductor devices and, more specifically, to a method for filling structures with doped or undoped silica glass. It relates to a HDP CVD process used to deposit films (e.g., for IMD, ILD, or STI applications).

It is often necessary in semiconductor processing to fill a high aspect ratio gap with insulating material. As device dimensions shrink and thermal budgets are reduced, void-free filling of high aspect ratio (AR) spaces (AR>3:1) becomes increasingly difficult due to limitations of existing deposition processes. The deposition of doped or undoped silicon dioxide assisted by high density plasma (HDP) chemical vapor deposition (CVD), a directional (bottom-up) CVD process, is the method currently used for high aspect ratio gap-fill. The method deposits more material at the bottom of a high aspect ratio structure than on its sidewalls. However, there is still formation of overhang at the entry region of the gap to be filled, which results from sputtering and redeposition reactions. The formation of overhang cannot be totally eliminated because non-directional reactions of neutral species and sputtering and redeposition reactions are inherent to the physics and chemistry of the HDP CVD process. However, overhang formation can be minimized by process optimization thus extending the utility of the method.

Several methods have been developed to extend the gap-fill capability of HDP CVD processes (see, for example, U.S. Pat. Nos. 6,030,881, 6,335,261, 6,395,150 and 6,596,654). Previous and current approaches involve the minimization or removal of side-wall overhang by either the use of a surface reactive ambient gas (e.g., hydrogen), or the use of multi-step process schemes including an active etch using a F-based etchant, such as $NF_3$. In many instances, the underlying structure is damaged by the chemical reaction between the gas phase species or simply by excessive sputter etch during the initial stages of the process. For example, in STI structures, a SiN liner is often deposited to enhance electrical isolation between various device elements and improve device performance. The liner can be eroded via several chemical or physical pathways, resulting in compromised device performance (usually demonstrated by higher leakage current).

FIG. 1A shows depicts a damaged STI structure following a conventional HDP CVD gap-fill process. The nitride liner has been damaged or completely removed on the trench sidewall near the trench opening (101), and at the bottom of the trench (103). The potential mechanisms of structure erosion include sputter-etch reactions and ion-assisted reactions, including oxidation via exposure to direct $O_2$ plasma or chemical etch by direct $H_2$ plasma. The result of structure erosion is incomplete electrical isolation between device elements and compromised device performance (a typical manifestation is increased leakage current, resulting in reduced data retention). This, in turn, forces designers to use deeper STI trenches to achieve the necessary level of isolation, which makes the gap-fill problem more severe.

A method is therefore necessary to preserve liner and structure integrity during process initiation and during transitions between process steps in the case of multi-step process schemes.

SUMMARY OF THE INVENTION

This invention accomplishes dielectric gap fill without liner erosion or further underlying structure attack by modulating the characteristics of the deposition process such that the deposition component of the process initially dominates the sputter component of the process. For example, reactive gasses are introduced in a gradient fashion into the HDP reactor and introduction of bias power onto the substrate is delayed and gradually increased, or reactor pressure is decreased. In the case of a multi-step etch enhanced gap fill process, the invention may involve gradually modulating deposition and etch components during transitions between process steps. By carefully controlling the transitions between process steps, including the introduction of reactive species into the HDP reactor and the application of source and bias power onto the substrate, structure erosion is prevented.

These and other features and advantages of the present invention are described below where reference to the drawings is made.

DETAILED DESCRIPTION OF THE INVENTION

Figure 1A:
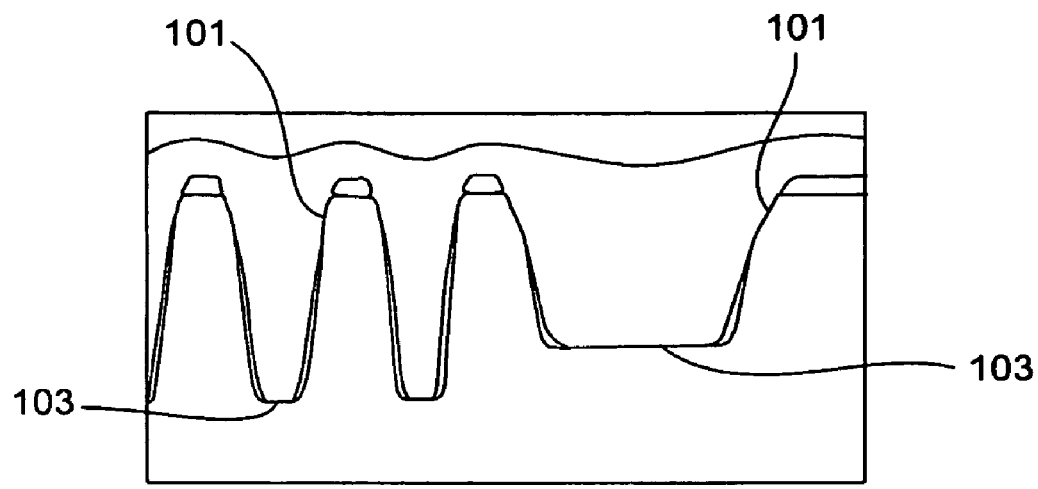
FIG. 1A depicts a rough schematic cross-sectional diagram of liner and structure erosion resulting from conventional HDP CVD gap-fill of a STI trench.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

This invention accomplishes dielectric gap fill without liner erosion or further underlying structure attack by modulating the characteristics of the deposition process such that the deposition component of the process initially dominates the sputter component of the process. For example, reactive gasses are introduced in a gradient fashion into the HDP reactor and introduction of bias power onto the substrate is delayed and gradually increased, or reactor pressure is decreased. In the case of a multi-step etch enhanced gap fill process, the invention may involve gradually modulating deposition and etch components during transitions between process steps. By carefully controlling the transitions between process steps, including the introduction of reactive species into the HDP reactor and the application of source and bias power onto the substrate, structure erosion is prevented.

Conventionally during HDP CVD gap fill process transitions, including process initiation, the composition of the reactive gas is in a transient state and device elements are exposed to the plasma. The method of the present invention provides gradual and/or delayed introduction of reactive gases (e.g., $H_2$, $O_2$, $NF_3$) into the reactor and gradual and/or delayed application of bias power onto the substrate among other process transition modulation techniques.

$H_2$ and $O_2$ are both known to react with SiN at finite rates in the presence of a direct HDP plasma. In addition, the rate of removal of silicon oxide by a hydrogen plasma is essentially the same as the removal rate of SiN, and such reactive species can damage other semiconductor substrate/dielectric materials such as SiC and silicon. The rate of material removal varies linearly with bias power. Therefore minimizing the exposure of device elements to reactive plasma gases and controlling the sputter component of the HDP process reduces the possibility of substrate erosion.

The present invention is described primarily with reference to an embodiment in which a substrate has a silicon nitride gap liner. SiN is often used as a CMP stop. It should be understood, however, that the invention is applicable to other semiconductor substrate surface materials, such as those noted above.

Process Characteristics and Parameters

The present invention, while applicable to any filling of any gap requiring dielectric fill, is particularly applicable to gap fill of high aspect ratio (e.g., >3:1), narrow width gaps. For example, the gap may have an aspect ratio of about 7:1, or even 10:1 or greater, and a narrow width, for example about 600 Å, or even 400 Å or less.

The gap fill process may be a single step or, more often, a multi-step process. In a single step process, the gap is filled in a single deposition step. More commonly, however, particularly for gaps with aspect ratios greater than 3:1, a multi-step, etch enhanced process is used and the invention is primarily described herein with respect to such a multi-step, etch enhanced process. It should be understood, however, that the invention is also applicable to a single step process. In either in accordance with the present invention, the gap is filled with a dielectric deposited by a HDP CVD process. Generally, a high density plasma is any plasma having electron density of at least about $5 \times 10^9$ electrons per cubic centimeter.

A deposition process begins with an electrical subsystem applying electrical energy of appropriate power and frequency to one or more electrodes of a process chamber of the reactor. The power and frequency are chosen to generate a high density plasma in the chamber, given the process gas concentration, pressure, and other process parameters. Providing the substrate (e.g., wafer) to the reactor may involve clamping the substrate to a pedestal or other support in the chamber. For this purpose, an electrostatic or mechanical chuck may be employed.

After the wafer is appropriately situated in the chamber, a gap on the substrate is filled or partially filled by HDP CVD deposition of dielectric. The process adjusts the substrate temperature and pressure to a level promoting the deposition of the dielectric layer. Typically, this temperature is between about 30–1000° C. (more preferably about 300 to 680° C., for example 450–550° C.), and the pressure is below 100 mT. The temperature control mechanism preheats the wafer first to drive out certain interfering species. During deposition, the temperature may be maintained by supplying a heat transfer gas between a back surface of the substrate and a surface of the substrate holder on which the substrate is supported during the film growth operation.

The high density plasma chemical vapor deposition process has deposition and sputter components. In accordance with the present invention, damage to the underlying structure is reduced or prevented by modulating the characteristics of the deposition process such that the deposition component of the process initially dominates the sputter component of the process.

In one embodiment, during the preheat step, prior to commencement of deposition, the wafer is inevitably exposed to direct plasma and carrier gases. The underlying structure (including features, e.g., gaps on the substrate surface and often a SiN gap liner) is susceptible to erosion during this time since it can be oxidized to SiOx or chemically etched if $O_2$, $H_2$ or other substrate reactive species are present in the plasma. Therefore, the invention provides a reactive-species (e.g., $O_2$ and $H_2$) free preheat step.

Process gas components such as $O_2$ or $H_2$ that are reactive with the semiconductor substrate, which may have a SiN gap liner or other surface film (e.g., SiC or $SiO_2$), are then gradually introduced, for example over a period of at least 3 seconds in duration; or at least 5 seconds in duration; or about 10 seconds in duration, and for example according to a linear function, to the reactor in a transition stage between the preheat and the initial deposition step.

Further, a liner step may be added in transition, before the first deposition step of the process. Deposition conditions for this liner are the same as for the initial deposition step, however, the HF power is delayed until after introduction of the silicon-containing precursor (e.g., $SiH_4$), for example for about 2 to 10 seconds, depending upon the deposition rate of the process (e.g., about 2 seconds for a relatively fast deposition rate), and then gradually increased, for example over a period of about 2 to 10 seconds (e.g., about 2 seconds), and for example according to a linear function, in the presence of the silicon-containing precursor, to the full level used for the deposition during this transitional liner step. In this way, some unbiased dielectric deposition occurs on the underlying structure prior to application of the HF (bias) power so that it is protected from the sputter component of the HDP deposition once the HF power is started, and is not subjected to full power plasma before at least some deposition has occurred. In some embodiments, the delay in introduction of the HF power is roughly inversely proportional to the process deposition rate in order to promote effective filling of the gap and prevent premature gap closure.

The reactor system introduces a process gas to the reaction chamber via one or more inlets. The process gas generally includes a dielectric precursor species such as high vapor pressure silicon-containing compounds, molecular oxygen or another oxygenated compound and a carrier gas. The carrier gas may be an inert carrier gas such as helium. However, in high aspect ratio gap fill applications the carrier gas preferably is or includes molecular or elemental hydrogen which inhibits precursor dissociation and promotes bottom-up gap fill. All the process gas components are introduced at specified flow rates and at specified times relative to one another, as noted above and described in further detail below.

An electrical subsystem applies a bias to the substrate, to thereby direct charged precursor species from the plasma onto the substrate and grow a dielectric film. Note that the substrate itself serves as an electrode here. Its bias accelerates charged species to it. Typically, the substrate electrode is powered by a high frequency RF bias and the induction coil is powered by a lower frequency RF source. As noted above, in accordance with the invention, the HF power is gradually increased to the full level used for the deposition during the transitional liner step so as not to subject the underlying structure to full power plasma before at least some deposition has occurred.

Dielectric is deposited in the gap or gaps on the substrate to a desired thickness, generally at the point where the gap is filled (single step gap fill) or, for higher aspect ration gaps, at the point where the overhang that forms at the gap entry point prevents further effective filling of the gap.

Any suitable deposition chemistry may be used. In general, an HDP CVD process gas will include a precursor for the deposition layer. If the dielectric is a silicon-containing dielectric, then the process gas will include a silicon-bearing compound such as silane The process gas will also generally include a carrier gas. The carrier gas may be an inert gas, such as He and/or other noble gases. Or the carrier gas may be or include elemental or molecular hydrogen. Oxygen to form the silicon oxide or other dielectric material may be provided by the silicon-containing precursor itself or from another process gas such as elemental oxygen ($O_2$), nitric oxide (NO), and/or nitrous oxide ($N_2O$).

The deposition process gas will have a particular composition represented by flow rates of the constituent gases in units of standard cubic centimeter per minute (sccm). The process gas will include a silicon-based precursor for the deposition layer, such as $SiH_4$, $SiF_4$, $Si_2H_6$, TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof. During deposition, the process decomposes the silicon-containing reactant to form a silicon-containing gas and plasma phase species, which can react on the surface of the substrate.

The process gas will also generally include a carrier gas. The carrier gas may be an inert gas, such as He and/or other noble gases. Or the carrier gas may be or include elemental or molecular hydrogen.

Oxygen to form the silicon oxide or other dielectric material may be provided by the silicon-containing precursor itself or from another process gas such as elemental oxygen ($O_2$), nitric oxide (NO), and/or nitrous oxide ($N_2O$).

Typical flow rate ranges for process gases of the present invention are listed below.

| Gas | Flow Rate (sccm) |
|---|---|
| $SiH_4$ | 10–300 |
| $O_2$ | 20–1000 |
| He | 0–500 |
| $H_2$ | 0–5000 |

Generally, other oxygen and silicon-containing compounds can be substituted for those listed in this table. Depending upon the atom counts in the precursor gases, the flow rate ranges may have to be changed. While there are no precise rules for modifying flow rates as a function of molecular structure, generally the flow rate of the silicon-containing precursor may be reduced by a factor corresponding to the number of silicon atoms in the molecule. So, for example, if the molecule contains two silicon atoms, one may expect to reduce the flow rate of the silicon-containing precursor to a level of between about 5 and 150 sccm.

In some embodiments, the flow rate of hydrogen employed is at least about 200 sccm, based on a 200 millimeter substrate. Larger substrates require higher flow rates. The flow rate may vary somewhat when special injector configurations are employed.

The invention is also practiced with process gases containing noble gas (e.g., argon, helium, or xenon), with helium being preferred, either as the sole carrier gas, or in a mixture with hydrogen. The use of noble gases can be practiced under the conditions of the above-described embodiments, and their flow rate can be used in order to modulate the effect of other process gas components (e.g., hydrogen) on the deposition profile of the deposited oxide film.

For doped dielectrics (particularly silicon dioxide based dielectrics), the process gas may include a dopant precursor such as a boron-containing gas, a phosphorus-containing gas, a carbon-containing gas, or a mixture thereof. In a specific embodiment, the gas includes one or more boron-containing reactants and one or more phosphorus-containing reactants and the dielectric film includes a phosphorus- and boron-doped silicon oxide glass (BPSG). Examples of suitable boron and phosphorus precursor gases include the following: $B_2H_6$ and $PH_3$.

If the dielectric is to contain an oxyfluoride (e.g., silicon oxyfluoride), then the process gas preferably includes a fluorine-containing reactant such as silicon hexafluoride ($SiF_4$). If the dielectric is to contain an oxynitride (e.g., silicon oxynitride), then the process gas preferably includes a nitrogen-containing reactant such as $N_2$, $NH_3$, $NF_3$, NO, $N_2O$, and mixtures thereof.

The method applies as well to the deposition of carbon-doped silicon oxide from process gas mixtures including organosilanes (e.g., TEOS (tetraethyl orthosilicate), TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof).

The temperature within the process vessel should be maintained sufficiently high to ensure that the dielectric deposition reaction proceeds efficiently. Hence, the temperature preferably resides at values between about 30 and 1000° C. This temperature will vary depending upon the types of precursors employed in the reaction. Further, the temperature may be limited by process constraints, such as thermal budget limitations that preclude temperatures above 700–750° C. Such constraints become increasingly common with advanced technologies and corresponding smaller feature sizes. For such applications, the process temperature is preferably maintained between about 30 and 750° C. In particularly preferred embodiments, the substrate temperature is maintained between about 300 and 600° C., even more preferably between about 350 and 450° C.

As indicated, to control the substrate temperature, the reactor may supply a heat transfer gas between a surface of the substrate and a surface of the substrate holder on which the substrate is supported during film deposition. The heat transfer gas may include at least one of helium and argon. The back-side helium pressure is set by the temperature requirements of the process (a typical range being between 0–15 Torr).

For some applications, it may be desirable to preheat the wafer to a pre-specified relatively low temperature and then gradually raise the temperature. This allows for isothermal operation. The goal is to start the deposition and then maintain the wafer temperature within a narrow range during the entire deposition process.

The pressure of the process chamber is set to a level suitable for the HDP CVD reaction. HDP CVD processes generally operate below 100 mT and preferably below 30 mT, for example between 1.5 and 25 mT. In practice, many processes operate below 5 mT, for example about 3 mT. Some other processes operate at increased pressure, in the range of about 26–75 mT. The pressure should allow relatively rapid deposition while maintaining a high density plasma under the applied frequency and power.

The low frequency power applied to the upper electrode (for generating the plasma) typically varies from 1 kW to 20 kW, and the high frequency power (for biasing the wafer) typically reaches at least about 0.2 W/cm$^2$ (preferably varying from about 0.5 kW to 10 kW) depending on the substrate size (e.g., 200 or 300 mm diameter) and the requirements of the specific process being used.

As indicated above, the bias applied to the substrate is typically a radio frequency bias. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz. The frequency range applied to the upper, plasma-generating electrode is typically between about 300 kHz and 27 MHz.

In another embodiment of the present invention, modulation of the deposition characteristics may be achieved by depositing the dielectric film on the substrate using a high density plasma chemical vapor deposition process in which the characteristics of the deposition process are modulated by changing the pressure in the deposition reactor such that the deposition component of the process initially dominates the sputter component of the process. Reactor pressure may be varied by throttling the flow of gasses exiting the reactor (e.g., with a butterfly valve) or spinning down the pumps supplying process gasses to the reactor. Higher reactor pressure results in lower plasma density raising the neutral component of the plasma. The reactor pressure can then be reduced gradually or stepwise to optimal gap fill conditions. This allows a bit of deposition to build up around feature corners to protect the structures on the substrate before gap fill begins.

For example, initial reactor pressure may be between about 26 and 75 mTorr, e.g., about 40 mTorr, and then subsequently decreased to about 1–10 mTorr, e.g., about 3 mTorr, after about 2–10 seconds, e.g., about 2 seconds. The pressure decrease may gradual over some or all of the initial period of time, and/or may include a step following the initial period of time.

As noted above, the method of the invention also applies to the gap fill using high density plasma deposition process involving in situ (single chamber) or sequential etch process steps. The invention also applies in instances where the deposition steps are etch-assisted, and the implementation does not essentially change. The method can be used in doped silica glass deposition processes as well, including PSG, BPSG and FSG.

In a typical high aspect ratio gap fill process, as a result of non-directional deposition reactions of neutral species in the plasma reactor and from sputtering/redeposition processes during deposition, some problematic top and sidewall deposition result in an overhang at the entry region of the gap and an accumulation of dielectric adjacent to the gap entry, before the gap is filled. Therefore, following this initial deposition step, the detrimental top and sidewall deposition is removed in an etch back process to facilitate further void free filling of the trench.

In such a multi-step process, after finishing the deposition step, the flow of deposition chemistry is turned off and the etchant chemistry is introduced to the reaction chamber via an inlet to conduct a plasma etch back. The etchant gas should dissociate at a controlled rate. An $NF_3$/He (carrier)-based etch chemistry is typically used. Molecular oxygen, Ar and/or $H_2$ may also be present in the etchant chemistry and are gradually introduced, for example over a period of at least 3 seconds in duration; or at least 5 seconds in duration; or about 10 seconds in duration, and for example according to a linear function, in the transition between the deposition and etch steps. This gradual transition to the etch stage can provide a benefit by reducing the flow rate of etch gases at the latter stages of the etch process as the device elements become exposed or nearly exposed, thereby decreasing the likelihood of damaging the underlying structure. All the process gas components are introduced at specified flow rates within the parameters noted above. In a specific embodiment, the etch is conducted using an inductively coupled plasma source in the reactor. The RF bias power applied to the substrate in the reactor is adjusted to between about 500 and 5000 W, for example 2000 W. It should be noted that the inductively coupled plasma (ICP) etch may alternatively be accomplished by a downstream microwave plasma etch. The etch back process preferentially removes dielectric top and sidewall overhang features at the gap opening thereby decreasing the gap's aspect ratio and facilitating further filling in subsequent deposition processing.

The etch back process may be carried out according to any appropriate etch enhanced gap fill etch back procedure, such as is described in U.S. Pat. No. 6,030,881, incorporated by reference herein in its entirety and for all purposes, for example. Suitable etch process condition ranges are as follows:

| Gas | Flow Rate (sccm) |
| --- | --- |
| $NF_3$ | 10–500 |
| $O_2$ | 0–1000 |

-continued

| Gas | Flow Rate (sccm) |
| --- | --- |
| He | 0–500 |
| $H_2$ | 0–5000 |
| Ar | 0–500 |

Suitable etch back process reactor pressure ranges from about 5 to 65 mT and duration from about 5–700 seconds. Of course, these parameters may be varied as is known in the art. For example, alternative etch gases, such as $NF_3$, $C_2F_6$, $SF_6$, etc., may be used. The etch back process is not purely isotropic, as there is bias on the wafer resulting in ion bombardment and anistropic etch. The etch back process may be conducted in a separate reactor process chamber, but is preferably conducted in the same chamber as the deposition to enable a single chamber, multi-step gap fill procedure.

The conditions are preferably set so that the etch is selective for the HDP CVD deposited dielectric (e.g., $SiO_2$) relative to the silicon generally barrier layer lining the trench. Adjustment of the process selectivity is within the skill in the art given the process parameters and description provided herein. The parameter values above are in reference to a 200 mm chamber. The process can be implemented in other chambers, for example, a 300 mm chamber as well. In that case, the flows need to be scaled accordingly.

The etch process removes oxide from the top and sidewalls and opens the gap for access of deposition ions to fill the gap from the bottom up in a subsequent HDP deposition.

Following the etch, etch process chemistry flows are gradually reduced, for example over a period of at least 3 seconds in duration; or at least 5 seconds in duration; or about 10 seconds in duration, and for example according to a linear function, and further deposition process for filling the remaining gap is performed by gradually introducing the deposition process gases into the reactor, as described above Again, the gradual introduction avoids damage to underlying structures, particularly corners of periphery structures and trenches that are exposed or nearly exposed during the preceding etch stage. The etch back and deposition process is then repeated until the gap is filled.

Thus, a multi-step etch enhanced embodiment of the invention involves gradually modulating deposition and etch components during transitions between process steps. The gradual introduction/modulation of process gasses and plasma power according to this invention has been demonstrated to successfully achieve gap fill without liner or underlying structure erosion. It should be noted that a gradual transition between process stages may be beneficial if practiced for any or all of the stage transitions, including the process initiation. Accordingly, the invention contemplates processes in which a gradual transition as described herein is used between at least two different stages and between up to all of the stages, in the case of a multi-step process.

Figure 1B:
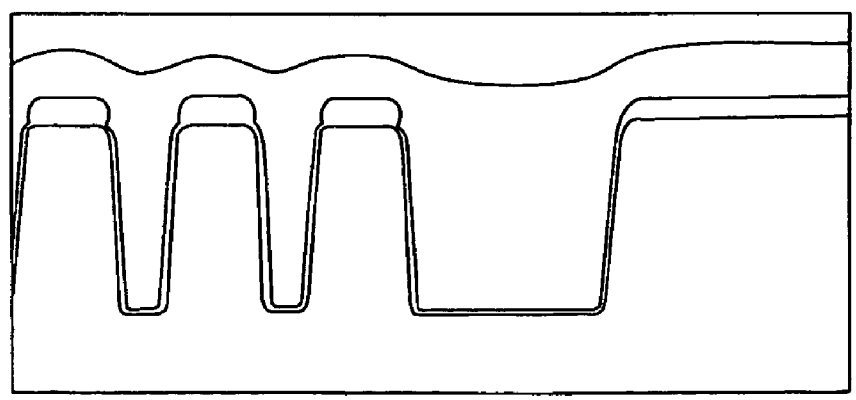
FIG. 1B depicts a rough schematic cross-sectional diagram of a STI trench following HDP CVD gap-fill in accordance with the present invention showing intact liner and underlying structure.

FIG. 1B depicts a rough schematic cross-sectional diagram of a STI trench following HDP CVD gap-fill in accordance with the present invention showing intact liner and underlying structure. Comparing to the structure illustrated in FIG. 1A which was filled with the same process sequence (deposition-etch-deposition) without, however, using flow and power ramping, it can be seen that the structures illustrated in FIG. 1B have been filled without chemical or sputter attack on the underlying structure.

One specific embodiment of the present invention is described and illustrated with reference to FIGS. 2–5. The figures show gradual gas flow and bias power application profiles for an etch-enhanced HDP CVD process, which includes an active $NF_3$-based etch step between two deposition steps. The method of the invention provides gradual and/or delayed introduction of reactive gases (e.g., $H_2$ and $O_2$) (FIGS. 2 and 3) into the reactor and gradual and/or delayed application of bias power onto the substrate (FIG. 4).

Figure 2:
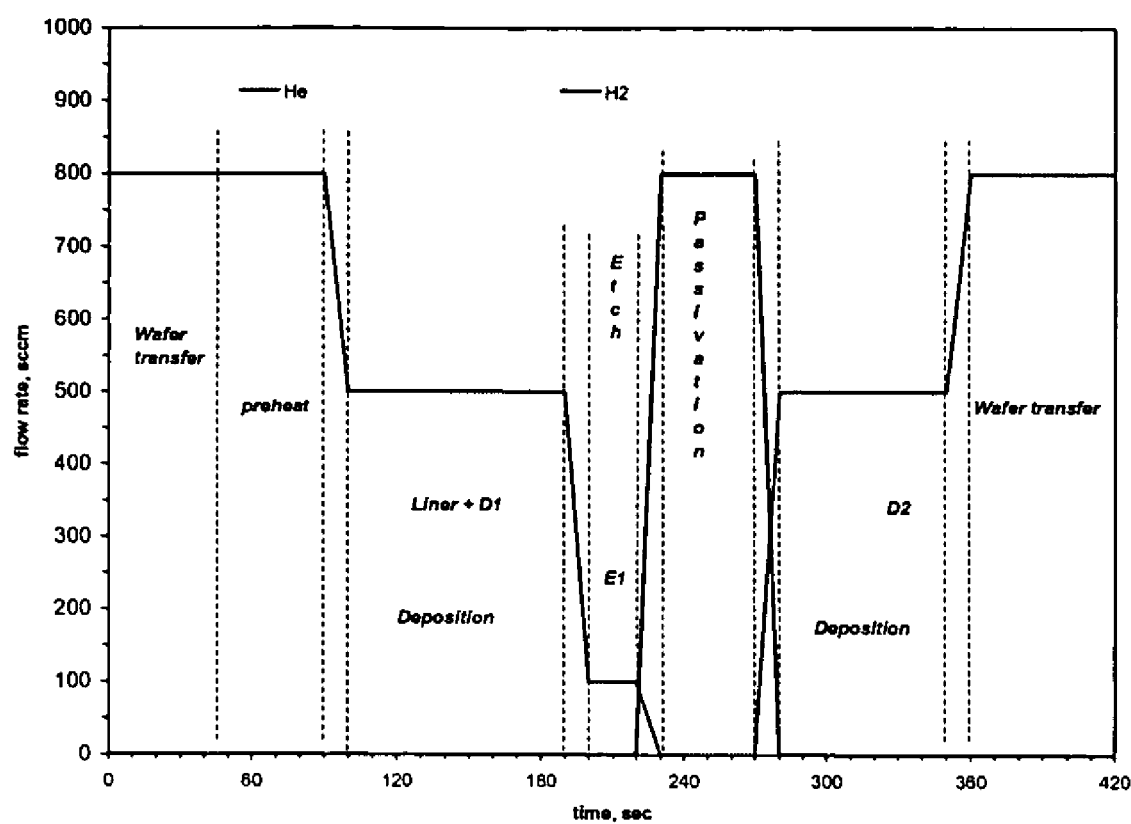
FIG. 2 depicts flow profiles for He and $H_2$ gases in accordance with a specific embodiment of the present invention.
Figure 3:
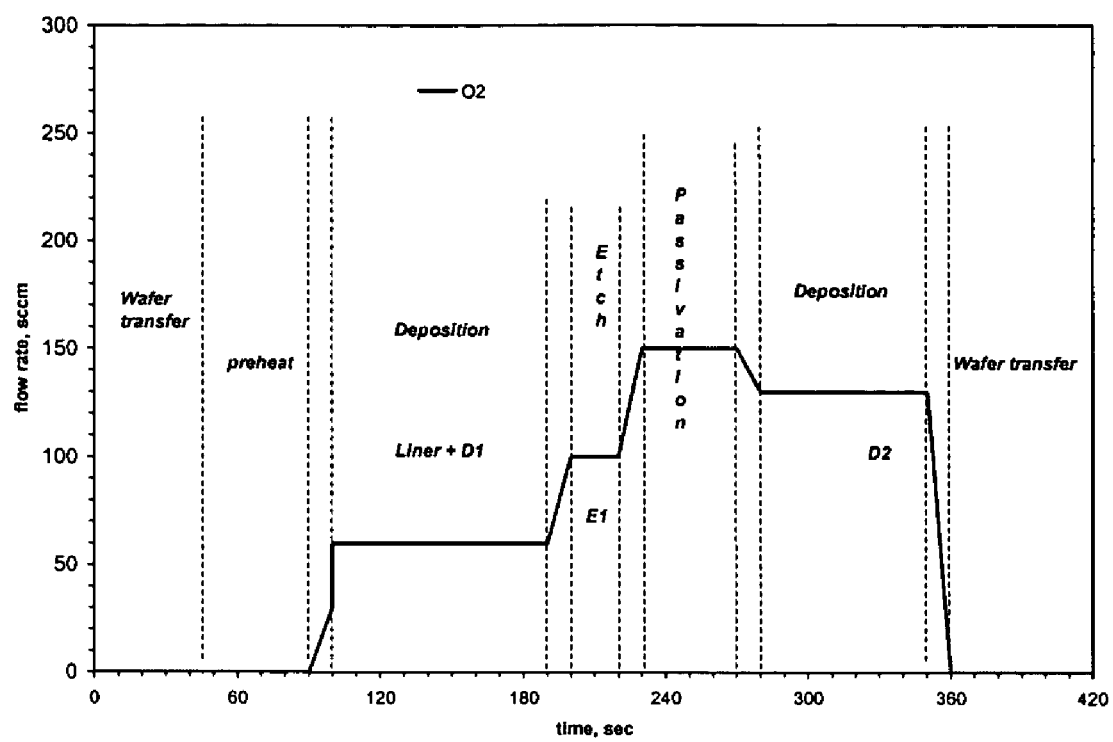
FIG. 3 depicts a flow profile for $O_2$ gas in accordance with a specific embodiment of the present invention.

FIGS. 2 and 3 depict flow profiles for He and $H_2$ gases and $O_2$, respectively, in accordance with a specific embodiment of the present invention. In a typical HDP CVD gap fill process, prior to deposition the wafer is exposed to direct plasma and carrier gases during the preheat step. The SiN liner is susceptible to erosion during this time since it can be oxidized to SiOx or chemically etched if $O_2$ or $H_2$ are present in the plasma. Therefore, the invention provides an $O_2$ and $H_2$ free preheat step; a He only plasma is maintained during preheat. In the first gas transition between the preheat to the deposition of the liner step, the transition time is kept at a minimum of 2 seconds, and may be as long as 10 seconds or longer, and the oxygen flow is ramped to a low value (e.g., about 25 sccm) during this time. This procedure subjects the wafer to no $H_2$ exposure and only minimal exposure to $O_2$ before the deposition begins, at which point the $O_2$ flow rate is raised to a suitable level, e.g., about 50 sccm.

In order to protect the underlying structure, which in a specific embodiment includes a SiN gap liner, a liner step is added before the first deposition step of the process. In the case of a $NF_3$ etch enhanced process, which includes three or more deposition-etch steps, the liner step is derived from the first deposition step D1 of the process. A lower SD ratio of 0.02 of the D1 process is targeted as the liner step. The deposition time is typically for 5 seconds which targets a thickness of 200 Å. It has been found that the introduction of HF power during the first 3 seconds of the liner step is helpful in protecting the nitride.

Figure 4:
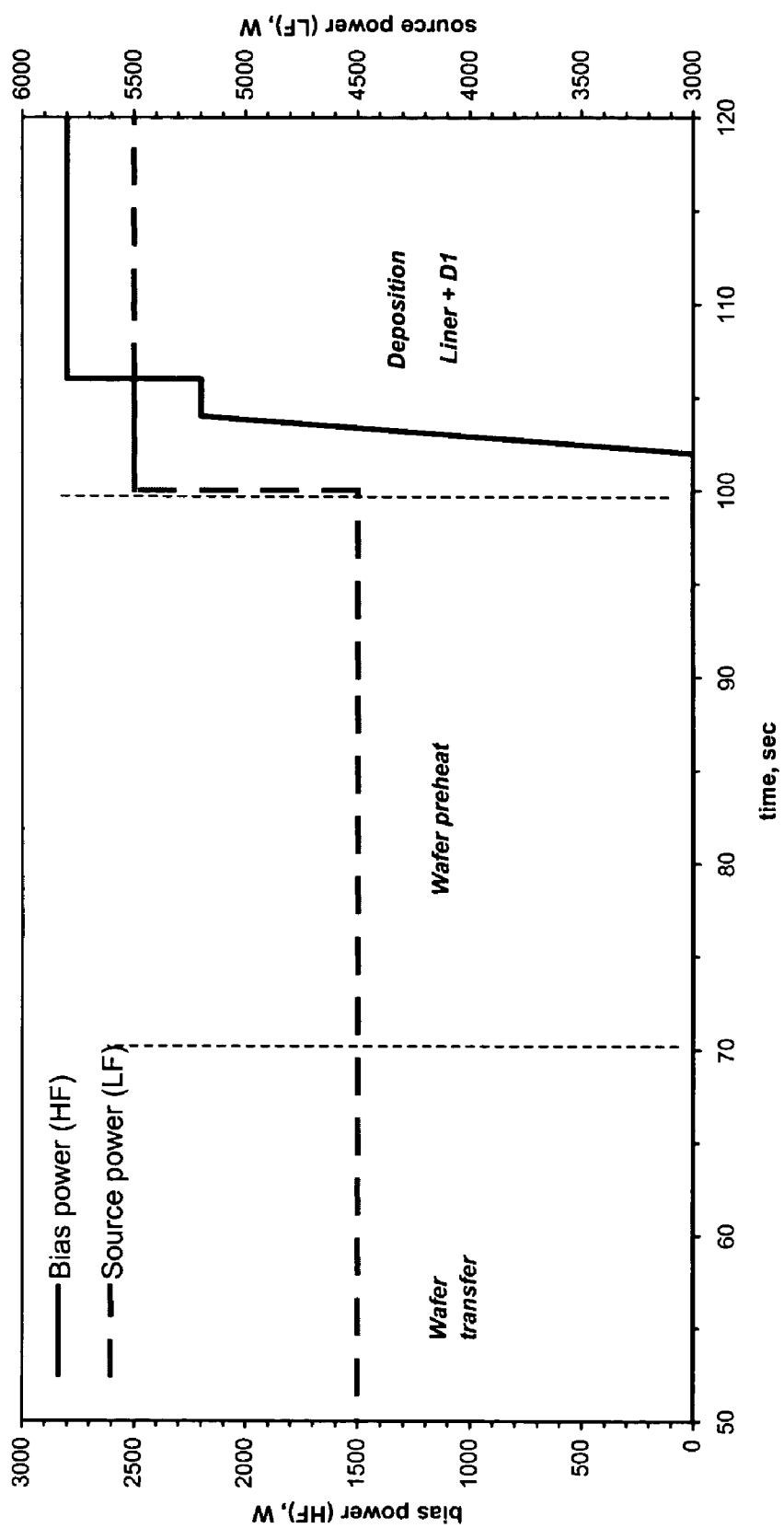
FIG. 4 depicts profiles of application of bias and source power in accordance with a specific embodiment of the present invention.

As shown in FIG. 4, in a specific example the introduction of HF power is delayed for 2 seconds, i.e., during the first two seconds of the liner step there is no HF power, in the following 2 seconds of deposition, HF power is ramped from zero to 2200 W as a linear function. In the last 2 seconds of the liner step HF power is stable at 2200 W and then transitions immediately into the second deposition step, at 2800 W, which is the actual D1 process, as a step function to the HF power in D1 step. There is no gas delay between liner deposition and deposition D1 since the gas flows are the same in both steps.

While described with reference to a multi-step gap fill process herein, the procedure and steps taken to prevent structure erosion noted above are also applicable to a single step gap fill deposition process.

Figure 5:
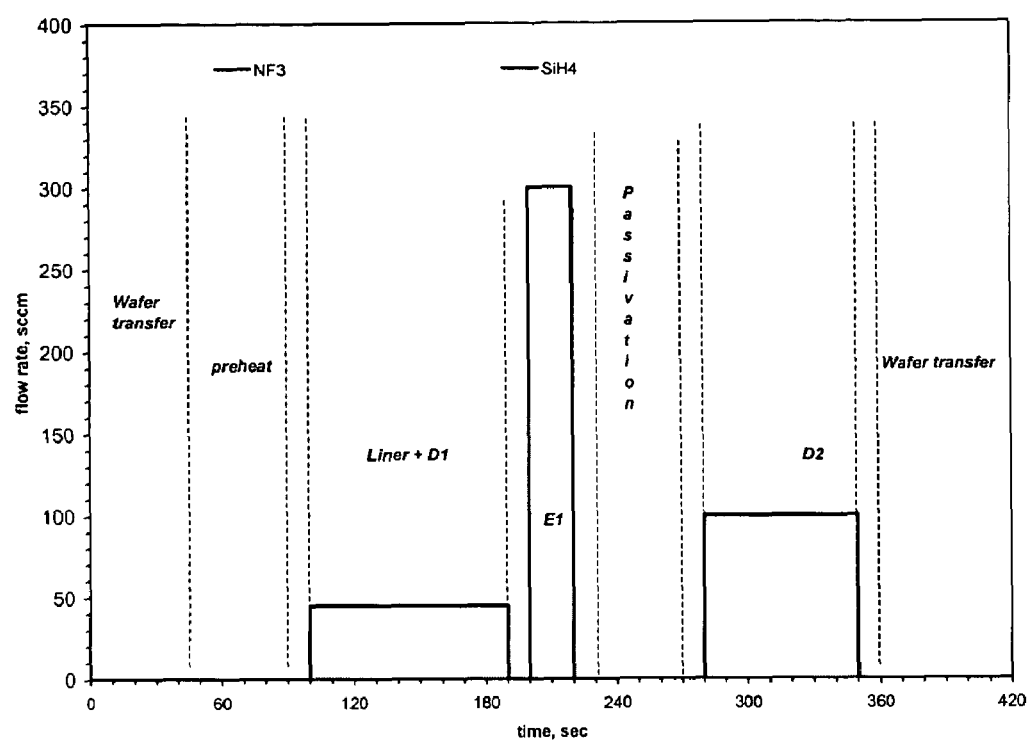
FIG. 5 depicts flow profiles for $SiH_4$ and $NF_3$ gases in accordance with a specific embodiment of the present invention.

FIG. 5 depicts flow profiles for $SiH_4$ and $NF_3$ gases, suitable deposition and etch precursors, in accordance with a specific multi-step etch enhanced embodiment of the present invention. As can be seen form the figure, the concentration and pressure of the precursor gas flows are stabilized in the pumps prior to introduction to the chamber so that their profiles are very clean and limited to the deposition and etch stages.

Implementation: Plasma Processing Reactor

Various plasma reactor designs are suitable for use with this invention. The particular design is not critical to this invention. It merely needs to support HDP CVD dielectric layer formation and etch back on appropriate substrates. Examples of suitable reactors include the Novellus SPEED reactor, available from Novellus Systems, Inc. of San Jose, Calif., and the Ultima reactor, available from Applied Materials, Inc. of Santa Clara, Calif.

The principal components of most suitable reactors include a reaction chamber, a process gas delivery system, a support for the substrate, one or more electrodes or radio frequency power source coupled to an induction coil to generate an inductively coupled plasma, and a bias source for the substrate. A temperature control system is typically used to heat the substrate. Suitable plasma processing reactors and described, for example, in U.S. Pat. Nos. 5,346,578, 5,405,480 and 5,605,599, the disclosures of which are incorporated by reference herein in their entirety and for all purposes.

Figure 6A:
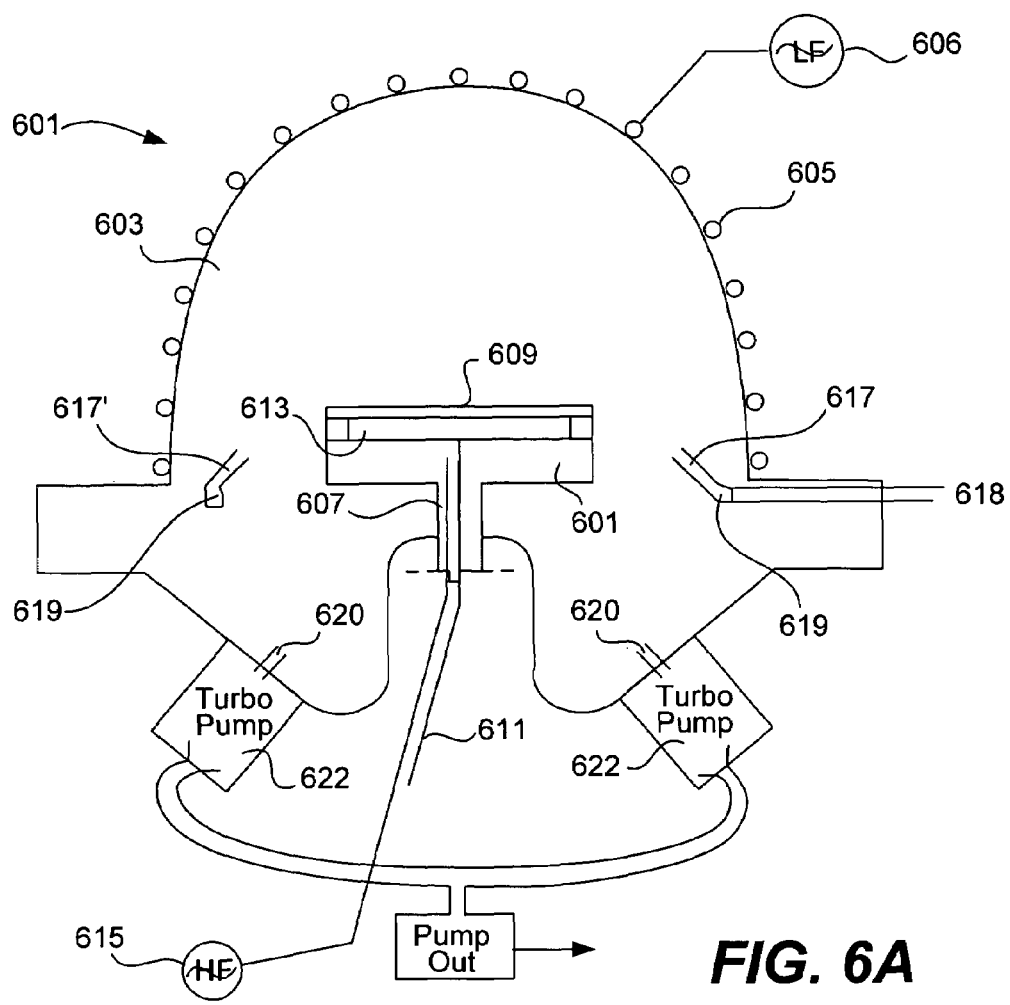
FIGS. 6A–6B depict vertical and horizontal, respectively, cross-sectional block diagrams depicting some components of a suitable HDP CVD reactor suitable for conducting a gap fill process in accordance with the present invention on semiconductor wafers.

FIG. 6A is a vertical cross-section block diagram depicting some components of a suitable plasma processing reactor suitable for conducting a DED gap fill process in accordance with the present invention on semiconductor wafers. As shown, the reactor 601 includes a process chamber 603 which encloses other components of the reactor and serves to contain the plasma generated by the radio frequency power source coupled to the induction coil 605 which surrounds the chamber on or embedded in the chamber walls. In one example, the process chamber walls are made from aluminum, aluminum oxide, and/or other suitable material. The coil 605 is powered by a "low frequency" radio frequency (RF) source 606. The power and frequency supplied by source 606 is sufficient to generate high-density plasma from the process gas.

Within the reactor, a wafer pedestal 607 supports a substrate 609. The pedestal typically includes a chuck 608 to hold the substrate in place during the deposition reaction. The chuck may be an electrostatic chuck, a mechanical chuck or various other types of chuck as are available for use in the industry and/or research.

A heat transfer subsystem including a line 611 for supplying a heat transfer gas controls the temperature of substrate 609. In some embodiments, the heat transfer fluid comprises at least one of helium and argon gas. The heat transfer fluid is supplied to a space 613 between the surface of the substrate and a surface of the chuck.

A "high frequency" RF source 615 serves to electrically bias substrate 609 and draw charged precursor species onto the substrate for the deposition or etch reactions. Electrical energy from source 615 is coupled to substrate 609 via an electrode or capacitive coupling, for example. Note that the bias applied to the substrate need not be an RF bias. Other frequencies and DC bias may be used as well. In a specific embodiment, source 615 supplies a radio frequency bias to the substrate with a power ranges from 0.5 kW to 10 kW.

Figure 6B:
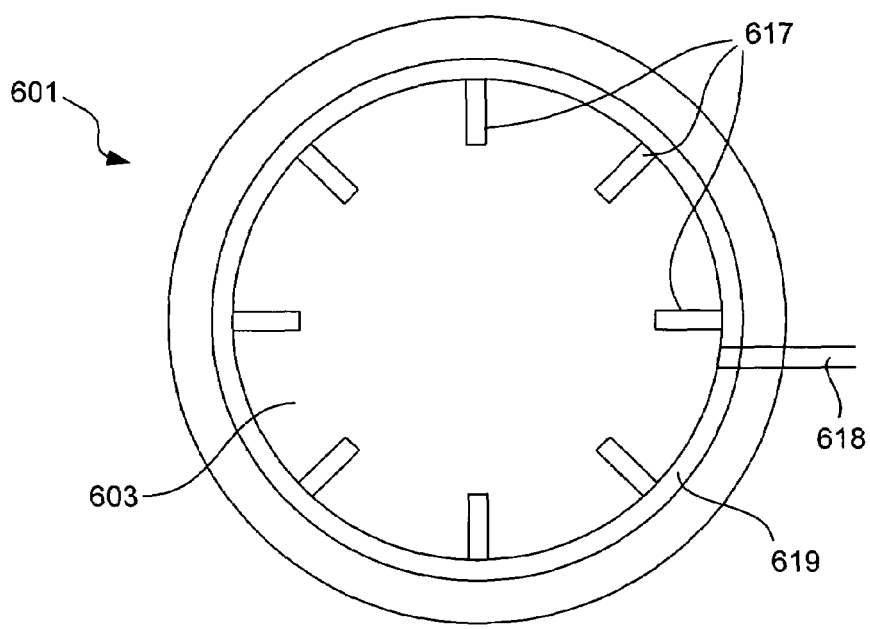

The process gases are introduced via one or more chamber inlets 617. The gases may be premixed or not. Other sources of dielectric precursor gases and carrier gases are also provided. Preferably, the process gas is introduced through a gas supply inlet mechanism including orifices. The gas or gas mixture may be introduced from a primary gas ring, which may or may not direct the gas toward the substrate surface. In this embodiment, a ring inlet(s) 618 is connected to the primary gas ring 619 to supply gas or gas mixture into the chamber via the chamber inlets 617. This arrangement is further illustrated in the horizontal cross-section of FIG. 6B which depicts a ring inlet and eight chamber inlets for process gas. Note that inlets, gas rings or other mechanisms for supplying process gas to the reactor process chamber are not critical to this invention. The sonic front caused by the gas entering the chamber will itself cause the gas to rapidly disperse in all directions—including toward the substrate.

The process gas exits the chamber 603 via an outlet or outlets 620. A vacuum pump (e.g., a turbomolecular pump) or pumps 622 typically draws the gas out and maintains a suitably low pressure within the reactor.

As noted above, the gap fill process of the present invention is preferably accomplished in a single reactor process chamber, but it may also be accomplished in a plurality of processing chambers. When more than one processing chamber is used, a pressure controlled transfer module should be used to transfer the wafers from one chamber to another. Such transfer modules and procedures are known to those of skill in the art.

Substrates and Dielectric Materials

The above-described processes and apparatuses may deposit dielectric on any type of substrate that requires thin dielectric layers. Often, the substrate will be a semiconductor wafer having gaps in need of dielectric filling. The invention is not, however, limited to such applications. It may be employed in a myriad of other fabrication processes such as for fabricating flat panel displays.

As indicated above, this invention finds particular value in integrated circuit fabrication. The gap filling processes are performed on partially fabricated integrated circuits employing semiconductor substrates. In specific examples, the gap filling processes of this invention are employed to form shallow trench isolation (STI), pre-metal dielectric (PMD), inter-metal layer dielectric (ILD) layers, passivation layers, etc.

As indicated, the invention can effectively fill gaps having widths of 0.1 microns or less, for example 0.09 micron or less, and aspect ratios of 6:1 or greater, for example 7:1, 8:1, or even 10:1 or greater. More aggressive structures having, e.g., greater aspect ratios and smaller widths may also be used.

The dielectrics employed to fill those gaps will often be a silicon oxide such as silicon dioxide, silicon oxynitride, silicon oxyfluoride, and doped variants of each of these, or even or carbon doped low-k materials. Therefore, the scope of the invention includes at least phosphorus-doped, boron/phosphorus-doped oxides and fluorine/phosphorus-doped oxides. As indicated, the dielectric may also be a phosphorus- and boron-doped silicon oxide glass (BPSG).

CONCLUSION

While this invention has been described in terms of a few preferred embodiments, it should not be limited to the specifics presented above. Many variations on the above-described preferred embodiments, may be employed. Therefore, the invention should be broadly interpreted with reference to the following claims.

What is claimed is:

1. A method of depositing a dielectric film on a semiconductor substrate, the method comprising:
  providing a semiconductor substrate having a feature to be filled in a process chamber of a high density plasma chemical vapor deposition reactor; and
  depositing the dielectric film on the semiconductor substrate using a high density plasma chemical vapor deposition (HDPCVD) process, the HDPCVD process having deposition and sputter components, wherein the characteristics of the HDPCVD process are modulated such that the deposition component of the HDPCVD process initially dominates the sputter component of the HDPCVD process, and further wherein the HDPCVD process comprises a preheat stage and a deposition stage temporally separated by a transition stage, and wherein the HDPCVD process components are modulated such that:

chemical species that are reactive with the substrate in a high density plasma are absent from the HDPCVD process chamber during the preheat stage, flow of substrate reactive species is started and gradually increased in the transition stage prior to application of HF plasma power, and HF plasma power is started and gradually increased after introduction of a silicon-containing precursor.

2. The method of claim 1, wherein the substrate reactive species is gradually introduced over a period of at least 3 seconds in duration.

3. The method of claim 2, wherein the substrate reactive species is gradually introduced over a period of about 10 seconds in duration.

4. The method of claim 3, wherein the flow of substrate reactive species is gradually increased according to a linear function.

5. The method of claim 4, wherein the flow of substrate reactive species further comprises a step function increase following the gradual linear function increase.

6. The method of claim 1, wherein the semiconductor substrate comprises a surface of a material selected from the group consisting of silicon, silicon nitride, silicon carbide, silicon oxide and combinations thereof.

7. The method of claim 1, wherein the semiconductor substrate comprises a protective nitride-based surface liner.

8. The method of claim 7, wherein the semiconductor substrate surface reactive species are selected from the group consisting of $O_2$ and $H_2$ and mixtures thereof.

9. The method of claim 1, wherein the deposition stage comprises liner and actual deposition phases.

10. The method of claim 9, wherein HF power is started and gradually increased over a period of about 2 seconds in duration according to a linear function in the liner phase following commencement of introduction of the silicon-containing precursor to the chamber at the start of the liner phase.

11. The method of claim 10, wherein the HF power is started about 1 second following commencement of introduction of the silicon-containing precursor to the chamber.

12. The method of claim 9, wherein the actual deposition phase begins with a step function increase in HF power following the liner phase.

13. The method of claim 10, wherein the actual deposition phase begins about 2 seconds after the gradual increase in HF power for the liner phase concludes.

14. The method of claim 9, wherein the HF power for the liner phase peaks at about 2200 W.

15. The method of claim 14, wherein the HF power for the actual deposition phase is about 2800 W.

16. The method of claim 1, wherein only one or more an inert gases is flowed into the chamber during the preheat stage.

17. The method of claim 16, wherein only He is flowed into the chamber during the preheat stage.

18. The method of claim 1, wherein the deposition process components are modulated such that the deposition process is conducted at a temperature that is decreased from an initial elevated pressure after a period of time.

19. The method of claim 18, wherein the initial pressure is between about 26 and 75 mTorr.

20. The method of claim 19, wherein the initial pressure is about 40 mTorr.

21. The method of claim 20, wherein the decreased pressure is about 1–10 mTorr.

22. The method of claim 21, wherein the decreased pressure is about 3 mTorr.

23. The method of claim 22, wherein the period of time is about 2–10 seconds.

24. The method of claim 23, wherein the period of time is about 2 seconds.

25. The method of claim 18, wherein the pressure decrease is gradual over at least part of the period of time.

26. The method of claim 18, wherein the modulation is gradual over the period of time.

27. The method of claim 25, wherein the modulation occurs in a step following the period of time.

28. The method of claim 1, wherein the deposition process is a single step process.

29. The method of claim 1, wherein the deposition process is a multi-step process.

30. The method of claim 29, wherein the multi-step process comprises:
(a) partially filling a gap on a semiconductor substrate with a dielectric using a high density plasma chemical vapor deposition process;
(b) partially removing dielectric deposited in the gap from the gap opening and sidewalls by an etch back process;
(c) further filling of the partially filled gap by a further high density plasma chemical vapor deposition process; and
(d) optionally, repeating (b) and (c) as necessary until the gap is filled.

31. The method of claim 30, wherein, process conditions are gradually modulated during transition between (a) and (b).

32. The method of claim 31, wherein etchant chemistry is gradually introduced over a period of at least 3 seconds in duration.

33. The method of claim 32, wherein etchant chemistry is gradually introduced over a period of about 10 seconds in duration.

34. The method of claim 32, wherein the etchant chemistry is gradually introduced according to a linear function.

35. The method of claim 32, wherein the etchant chemistry comprises a fluorine-containing species.

36. The method of claim 32, wherein the etchant chemistry comprises $NF_3$.

37. The method of claim 31, further wherein process conditions are gradually modulated during transition between (b) and (c).

38. The method of claim 37, wherein etchant chemistry is gradually reduced over a period of at least 3 seconds in duration.

39. The method of claim 38, wherein etchant chemistry is gradually reduced over a period of about 10 seconds in duration.

40. The method of claim 37, wherein the etchant chemistry is gradually reduced according to a linear function.

41. The method of claim 36, wherein all deposition and etch steps are conducted in a single plasma reactor chamber.

* * * * *